US012588535B2

(12) United States Patent
Tsai et al.

(10) Patent No.: US 12,588,535 B2
(45) Date of Patent: Mar. 24, 2026

(54) SEMICONDUCTOR DEVICE HAVING DISMANTLABLE STRUCTURE AND METHOD THEREFOR

(71) Applicant: NXP B.V., Eindhoven (NL)

(72) Inventors: Yu Ling Tsai, Kaohsiung City (TW); Yao Jung Chang, Kaohsiung (TW); Yen-Chih Lin, Hsinchu City (TW); Tzu Ya Fang, Tainan City (TW); Jian Nian Chen, Kosiiung City (TW); Yi-Hsuan Tsai, Kaohsiung (TW)

(73) Assignee: NXP B.V., Eindhoven (NL)

( * ) Notice: Subject to any disclaimer, the term of this patent is extended or adjusted under 35 U.S.C. 154(b) by 425 days.

(21) Appl. No.: 18/484,533

(22) Filed: Oct. 11, 2023

(65) Prior Publication Data
US 2025/0125159 A1 Apr. 17, 2025

(51) Int. Cl.
*H01L 21/60* (2006.01)
*H01L 21/56* (2006.01)

(52) U.S. Cl.
CPC ............ *H01L 21/60* (2021.08); *H01L 21/563* (2013.01); *H01L 2021/60247* (2013.01)

(58) Field of Classification Search
CPC ................... H01L 21/60; H01L 21/563; H01L 2021/60247; H01L 21/6835; H01L 23/16; H01L 24/81; H01L 23/562; H01L 21/561; H01L 24/16; H01L 25/105; H01L 2221/68377; H01L 2223/6677; H01L 2224/16225; H01L 2224/32225; H01L 2224/73204; H01L 2225/1023; H01L 2225/1041; H01L 2924/00; H01L 2924/00012; H01L 2924/00014;
(Continued)

(56) References Cited

U.S. PATENT DOCUMENTS 6,709,543 B2    3/2004  Kurosawa
7,115,482 B2    10/2006 Maki et al.
(Continued)

FOREIGN PATENT DOCUMENTS

WO          2019179184 A1    9/2019

OTHER PUBLICATIONS

Hu, I., "Investigation of Design and Material Optimization on High bandwidth Package on Package", 2017 18th International Conference on Electronic Technology Packaging (ICEPT), Aug. 16-19, 2017.
(Continued)

*Primary Examiner* — Elias Ullah

(57) ABSTRACT

A semiconductor device having dismantlable structure is provided. The method includes forming a packaged semiconductor die by mounting the semiconductor die onto a package substrate in a flip chip orientation, attaching an interposer substrate over a backside of the semiconductor die, and encapsulating with an encapsulant the semiconductor die and remaining gap region between the package substrate and the interposer substrate. A bond pad of the semiconductor die is interconnected with a conductive trace of the package substrate. The interposer substrate includes a plurality of conductive pads exposed at a top surface and interconnected with the package substrate. A dismantlable structure is attached on the top surface of the interposer substrate. A first region of the dismantlable structure covers the plurality of conductive pads.

20 Claims, 7 Drawing Sheets

(58) Field of Classification Search
CPC ..... H01L 2924/014; H01L 2924/15311; H01L
2924/181
See application file for complete search history.

(56) References Cited

U.S. PATENT DOCUMENTS

| | | |
|---|---|---|
| 7,563,642 B2 | 7/2009 | Higashino |
| 9,647,709 B1 | 5/2017 | Li |
| 9,704,823 B2 | 7/2017 | Kamphuis et al. |
| 10,304,817 B2 | 5/2019 | Lin et al. |
| 2015/0179616 A1 | 6/2015 | Lin et al. |
| 2020/0006234 A1 | 1/2020 | Jeng et al. |
| 2020/0043908 A1 | 2/2020 | Chung et al. |

OTHER PUBLICATIONS

Lan, J., "Simulation of High Bandwidth Package on Package
(HBPOP) Warpage and its effect on Thermal Cycling", 2018 20th
International Conference on Electronic Materials and Packaging
(EMAP), Dec. 17-20, 2018.

SEMICONDUCTOR DEVICE HAVING DISMANTLABLE STRUCTURE AND METHOD THEREFOR

BACKGROUND

Field

This disclosure relates generally to semiconductor device packaging, and more specifically, to a semiconductor device having a dismantlable structure and method of forming the same.

Related Art

Today, there is an increasing trend to include sophisticated semiconductor devices in products and systems that are used every day. These sophisticated semiconductor devices may include features for specific applications which may impact the configuration of the semiconductor device packages, for example. With such features and applications, the configuration of the semiconductor device packages may limit performance of the semiconductor devices or impact the costs of the semiconductor devices. Accordingly, significant challenges exist in accommodating these features and applications while minimizing the impact on semiconductor devices' performance and costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device having a dismantlable structure. The semiconductor device includes the dismantlable structure attached at a top side of a packaged semiconductor die. The packaged semiconductor die is formed with a flip-chip mounted semiconductor die on a package substrate and an interposer substrate mounted over the semiconductor die and interconnected with the package substrate. The semiconductor die being disposed between the package substrate and the interposer substrate is encapsulated with an encapsulant. The dismantlable structure is formed from a substantially rigid sheet of non-conductive material and attached to a top side of the packaged semiconductor die. The dismantlable structure includes a first region configured to temporarily protect underlying features of the packaged semiconductor die and a second region substantially surrounding the first region. The second region is attached to the top side of the packaged semiconductor die by way of an adhesive disposed along an outer perimeter. The second region is separated from the first region by a series of gaps strung together around a perimeter of the first region. A plurality of connecting segments joins the first region and the second region across the gaps. The connecting segments are configured to be severed (e.g., by way of laser ablation) to completely separate the first region from the attached second region. After severing each of the connecting segments, the first region of the dismantlable structure is removed and the underlying features of the packaged semiconductor die are revealed. Accordingly, the dismantlable structure may protect features (e.g., contact pads, traces) formed at the top side of the packaged semiconductor die from damage or contamination during handling and subsequent packaging steps, then reveal these features in pristine condition by removing the first region, for example.

Figure 1:
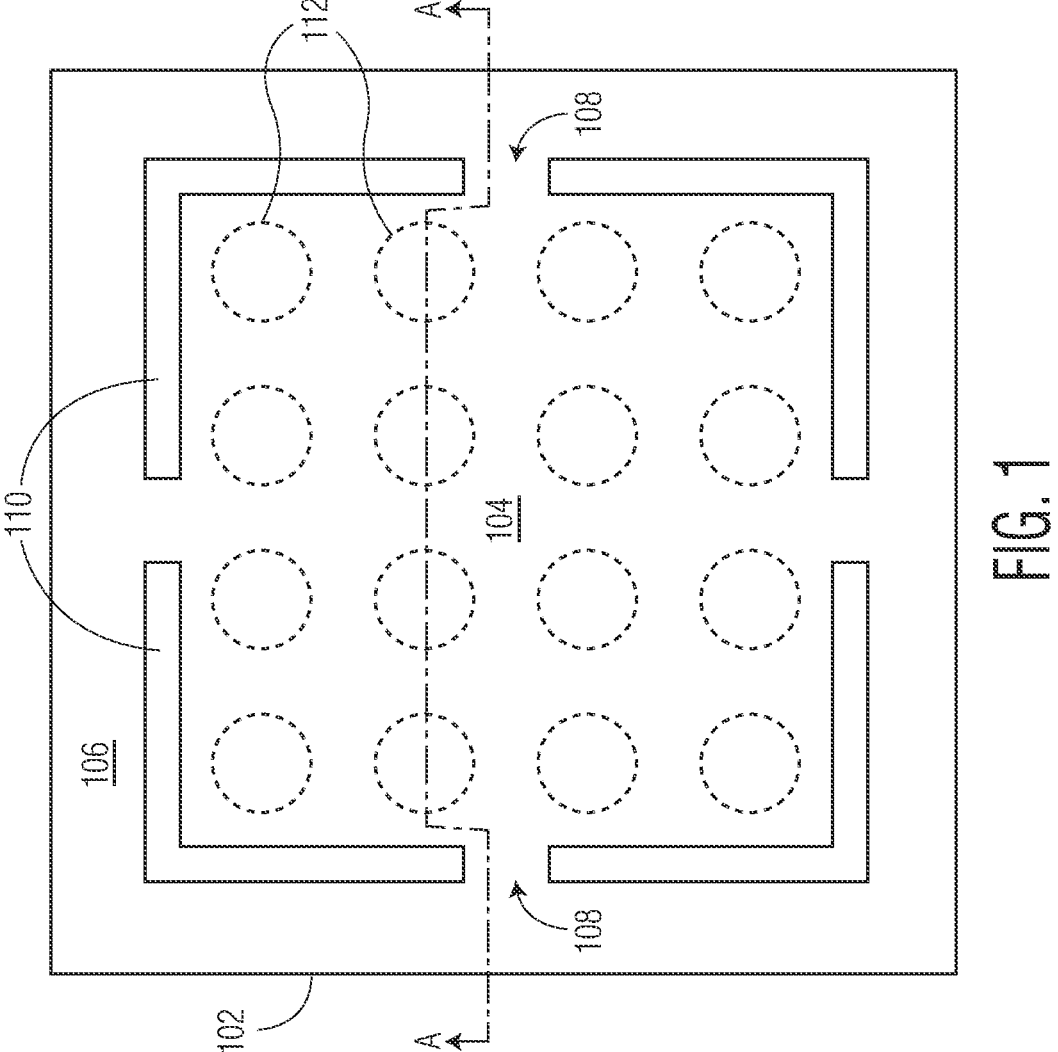
FIG. 1 illustrates, in a simplified top-side-up plan view, an example semiconductor device having a dismantlable structure at a stage of manufacture in accordance with an embodiment.

FIG. 1 illustrates, in a simplified top-side-up plan view, an example semiconductor device 100 having a dismantlable structure in accordance with an embodiment. At this stage, the semiconductor device 100 includes the dismantlable structure 102 attached at a top side of an at least partially assembled packaged semiconductor die (not shown). The dismantlable structure 102 includes a first region 104 and a second region 106. The first region 104 and the second region 106 are laterally separated by a plurality of gaps (e.g., open regions through the dismantlable structure) 110. For example, the first region 104 and the second region 106 are substantially isolated from one another by way of the gaps 110. A plurality of connecting segments 108 of the dismantlable structure 102 join or connect the first region 104 and the second region 106. The connecting segments 108 are formed as narrow sections of the dismantlable structure 102 flanked on two sides (e.g., opposing sides) by the gaps 110. The connecting segments 108 are configured to be substantially removed to completely separate the first region 104 and the second region 106 from one another. The size, shape, and location of the first region 104, the second region 108, and the connecting segments 108 depicted in FIG. 1 are chosen for illustration purposes. Cross-sectional views of examples of the semiconductor device 100 taken along line A-A of FIG. 1 at various stages of manufacture are depicted in FIG. 2 through FIG. 6.

In this embodiment, the dismantlable structure 102 is formed from a sheet of substantially rigid non-conductive material (e.g., FR5 laminate) that may include a glass cloth base (e.g., woven fiberglass) reinforced in an epoxy resin. The first region 104, the second region 106, and the connecting segments 108 of the dismantlable structure 102 are formed from the same sheet of non-conductive material. The dismantlable structure 102 is configured to provide structural support (e.g., warpage control) to the semiconductor device 100 and to provide temporary protection of sensitive features (e.g., metal traces, pads, sensor structures) of the semiconductor device 100 during one or more stages of manufacturing.

In this embodiment, the first region 104 of the dismantlable structure 102 is substantially surrounded by the second region 106 and is substantially separated from the second region by the plurality of gaps 110. The second region 106 is affixed to the top surface of the underlying at least partially assembled packaged semiconductor die by way of an adhesive (not shown). The second region 106 is located proximate to an outer perimeter portion of the underlying at least partially assembled packaged semiconductor die. The first region 104 is located over a plurality of conductive pads 112 formed at the top surface of the underlying at least partially assembled packaged semiconductor die. The term
"conductive" as used herein generally refers to electrical
conductivity unless otherwise described. In this embodi-
ment, the first region 104 is configured to protect the
conductive pads 112 during subsequent handling and pack-
aging operation. The first region 104 is held in place over the
plurality of conductive pads 112 by way of the connecting
segments 108 being connected to the attached second region
106, for example. Thus, the first region 104 is not directly
attached to the top surface of the underlying at least partially
assembled packaged semiconductor die.

By having the first region 104 of the dismantlable struc-
ture 102 held in place by way of the connecting segments
108, the first region 104 may be disconnected and subse-
quently removed by disconnecting the connecting segments
108. In this embodiment, the first region 104 is disconnected
and completely separated from the second region 106 by
severing each of the plurality of connecting segments 108.
The connecting segments may be substantially removed and
severed by way of laser ablation, for example. After severing
each of the plurality of connecting segments 108, the dis-
connected first region 104 may be removed by known
techniques such as vacuum-assisted pick-and-place or grav-
ity-assisted rotate and drop. After removing the first region
104 of the dismantlable structure 102, the second region 106
remains attached to the semiconductor device 100 and
continues to provide structural support to the semiconductor
device 100. In some embodiments, product markings may be
laser scribed or otherwise printed on a portion of the first
region 104 at a subsequent stage, for example.

Figure 2:
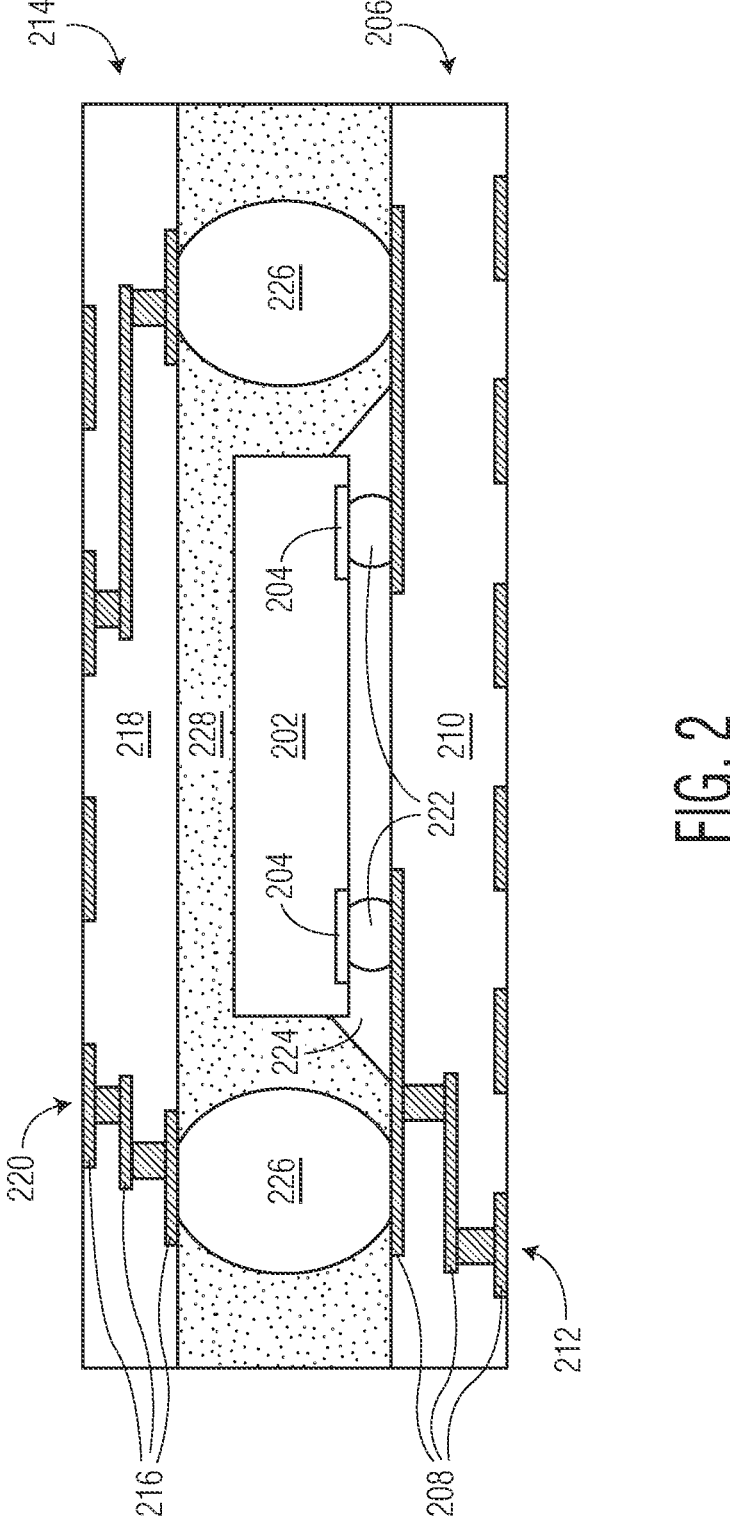
FIG. 2 through FIG. 6 illustrate, in simplified cross-sectional views, the example semiconductor device taken along line A-A of FIG. 1 at various stages of manufacture in accordance with an embodiment.

FIG. 2 illustrates, in a simplified cross-sectional view, the
example semiconductor device 100 at a stage of manufac-
ture in accordance with an embodiment. At this stage, the
semiconductor device 100 includes an at least partially
assembled packaged semiconductor die 202. In this embodi-
ment, the semiconductor die 202 is flip chip mounted (e.g.,
active side down) on a top side of a package substrate 206.
A bottom side of an interposer substrate 214 is intercon-
nected with the top side of the package substrate 206 by way
of a plurality of conductive substrate connectors 226. The
semiconductor die 202 is disposed between the package
substrate 206 and the interposer substrate 214 and is at least
partially surrounded by the plurality of substrate connectors
226. Even though the embodiment of FIG. 2 is depicted in
a high bandwidth package-on-package (HBPoP) type con-
figuration, embodiments in other package type configura-
tions are anticipated by this disclosure.

The semiconductor die 202 has an active side (e.g., major
side having circuitry, bond pads) and a backside (e.g., major
side opposite of the active surface). In this embodiment, the
active side of the semiconductor die 202 is mounted on the
package substrate 206 and interconnected utilizing bond
pads 204 at the active side, for example. In this embodiment,
the semiconductor die 202 is configured in a flip-chip
orientation having the active side mounted on the package
substrate 206. The semiconductor die 202 may be formed
from any suitable semiconductor material, such as silicon,
germanium, gallium arsenide, gallium nitride, and the like.
The semiconductor die 102 may further include any digital
circuits, analog circuits, RF circuits, power circuits,
memory, processor, MEMs, sensor, the like, and combina-
tions thereof at the active side.

In this embodiment, the package substrate 206 is formed
as a multi-layer laminate structure having conductive fea-
tures such as metal traces 208 and interlevel vias separated
by a non-conductive material (e.g., FR-4) 210. As depicted
in FIG. 2, the active side of the semiconductor die 202 is affixed at the top side of the package substrate 206 by way
of conductive die connectors 222 and underfilled with an
epoxy material 224. The die connectors 222 may include
suitable die connectors such as solder bumps, gold studs,
copper pillars, and the like. A first portion of the metal traces
208 exposed at the top side of the package substrate 206 are
interconnected with the semiconductor die 202. The plural-
ity of conductive substrate connectors 226 are affixed to a
second portion of the metal traces 208 exposed at the top
side of the package substrate 206. The conductive substrate
connectors 226 are configured to provide a conductive
connection between the package substrate 206 and the
interposer substrate 214, for example. The conductive sub-
strate connectors 226 may include suitable conductive con-
nector structures such as solder balls, gold studs, copper
pillars, and the like. The package substrate 206 further
includes connector pads 212 (e.g., exposed trace portions)
formed at the bottom side of the package substrate 206. The
metal traces 208 and the connector pads 212 may be formed
from a suitable metal such as copper, for example. In this
embodiment, the package substrate 206 may be character-
ized as a redistribution package substrate.

The interposer substrate 214 is formed as a multi-layer
laminate structure in this embodiment, having conductive
features such as metal traces 216 and interlevel vias sepa-
rated by a non-conductive material 218. The interposer
substrate 214 is interconnected with the package substrate
206 and the semiconductor die 202 by way of the conductive
substrate connectors 226. In some embodiments, the bottom
side of the interposer substrate 214 may be attached to the
backside of the semiconductor die 202 by way of an adhe-
sive (not shown). A portion of the metal traces 216 exposed
at the bottom side of the interposer substrate 214 are affixed
to the plurality of conductive substrate connectors 226. The
interposer substrate 214 further includes package-on-pack-
age (POP) pads 220 (e.g., exposed trace portions) formed at
the top side of the interposer substrate 214. The POP pads
220 are configured for attachment of external device such as
a memory or an antenna, for example. The metal traces 216
and the POP pads 220 may be formed from a suitable metal
such as copper, for example. In this embodiment, the inter-
poser substrate 214 may be characterized as a redistribution
interposer substrate.

In an alternative embodiment, the semiconductor die 202
with die connectors 222 and the plurality of substrate
connectors 226 may be placed onto a carrier substrate (not
shown) and encapsulated with the encapsulant 228. After
encapsulation with the encapsulant 228, the carrier may be
removed exposing portions of the die connectors 222 and the
plurality of substrate connectors 226. The package substrate
206 may be applied to a bottom side of the encapsulated
semiconductor die 202 such that the conductive features 208
of the package substrate 206 are connected to the exposed
portions of the die connectors 222 and the plurality of
substrate connectors 226. The package substrate 206 may
further include package connector pads 212 (e.g., exposed
trace portions) formed at the bottom side of the package
substrate 206. The package substrate 206 may be formed as
a build-up substrate directly on the bottom side of the
encapsulated semiconductor die 202 or may be provided as
a pre-formed substrate otherwise applied on the bottom side
of the encapsulated semiconductor die 202.

A top side of the encapsulated semiconductor die 202 may
be ground after encapsulation to expose top portions of the
plurality of substrate connectors 226. The interposer sub-
strate 214 may be applied to the top side of the encapsulated
semiconductor die 202 after exposing the top portions of the plurality of substrate connectors 226 such that the conductive features 216 of the interposer substrate 214 are connected to the exposed portions of the plurality of substrate connectors 226. The interposer substrate 214 may further include PoP pads 220 (e.g., exposed trace portions) formed at the top side of the interposer substrate 214. The interposer substrate 214 may be formed as a build-up substrate directly on the side of the encapsulated semiconductor die 202 or may be provided as a pre-formed substrate otherwise applied on the top side of the encapsulated semiconductor die 202.

Figure 3:
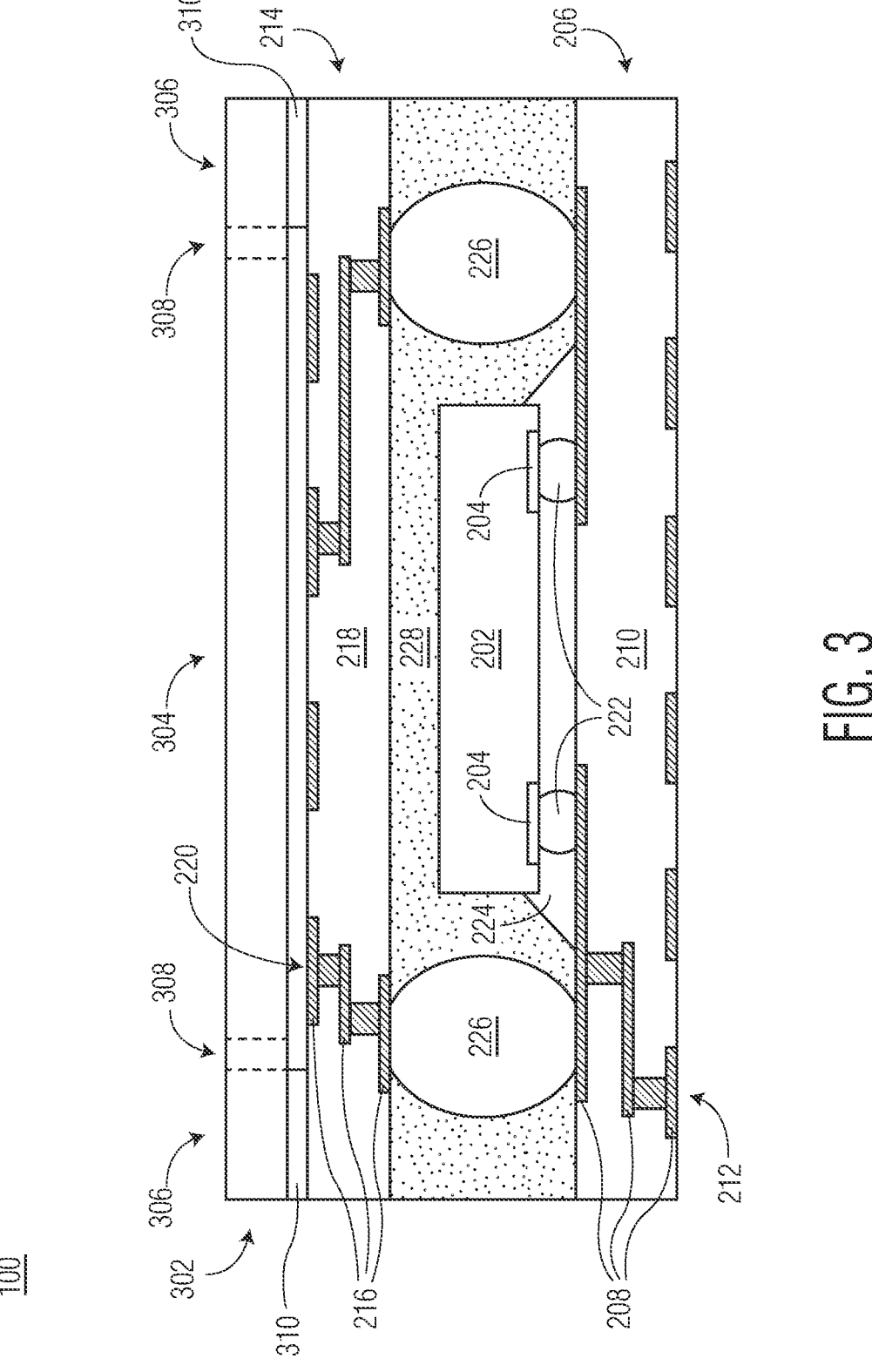

FIG. 3 illustrates, in a simplified cross-sectional view, the example semiconductor device 100 at a subsequent stage of manufacture in accordance with an embodiment. At this stage, the semiconductor device 100 includes a dismantlable structure 302 affixed to the top side of the interposer substrate 214. In this embodiment, the dismantlable structure 302 includes a first region 304, a second region 306 substantially surrounding the first region 304, and a plurality of connecting segments 308. The dismantlable structure 302, first region 304, second region 306, and connecting segments 308 may correspond to the dismantlable structure 102, first region 104, second region 106, and connecting segments 108 depicted in FIG. 1, for example.

In this embodiment, the first region 304 and the second region 306 are substantially isolated from one another by way of gaps (not shown) formed between the first region 304 and the second region 306. The plurality of connecting segments 308 (shown as dashed lines) of the dismantlable structure 302 provide a direct connection between the first region 104 and the second region 106. The connecting segments 108 are formed as narrow sections of the dismantlable structure 102 flanked on opposing sides by the gaps. The connecting segments 108 are configured to be severed (e.g., substantially removed) to completely separate the first region 104 and the second region 106 from one another.

In this embodiment, the dismantlable structure 302 is formed from a sheet of substantially rigid non-conductive material such as an FR5 laminate material. The first region 304, the second region 306, and the connecting segments 308 of the dismantlable structure 302 are formed from the same sheet of non-conductive material, for example. In this embodiment, the first region 304 of the dismantlable structure 302 is substantially surrounded by the second region 306. The second region 306 is attached to the top side of the interposer substrate 214 by way of an adhesive 310. The second region 306 is located proximate to an outer perimeter portion of the interposer substrate 214. The first region 304 is configured and arranged to cover the plurality of PoP pads 220 formed at the interposer substrate 214. For example, the first region 304 is configured to protect the POP pads 220 during subsequent handling and packaging operations. The first region 304 is held in place over the plurality of the POP pads 220 by way of the connecting segments 308 being connected to the attached second region 306, for example. In this embodiment, the first region 304 is not directly attached to the underlying top side of the interposer substrate 214. In this embodiment, the first region 304 of the dismantlable structure 302 is configured to be disconnected and subsequently removed by disconnecting the connecting segments 308 at a subsequent stage.

Figure 4:
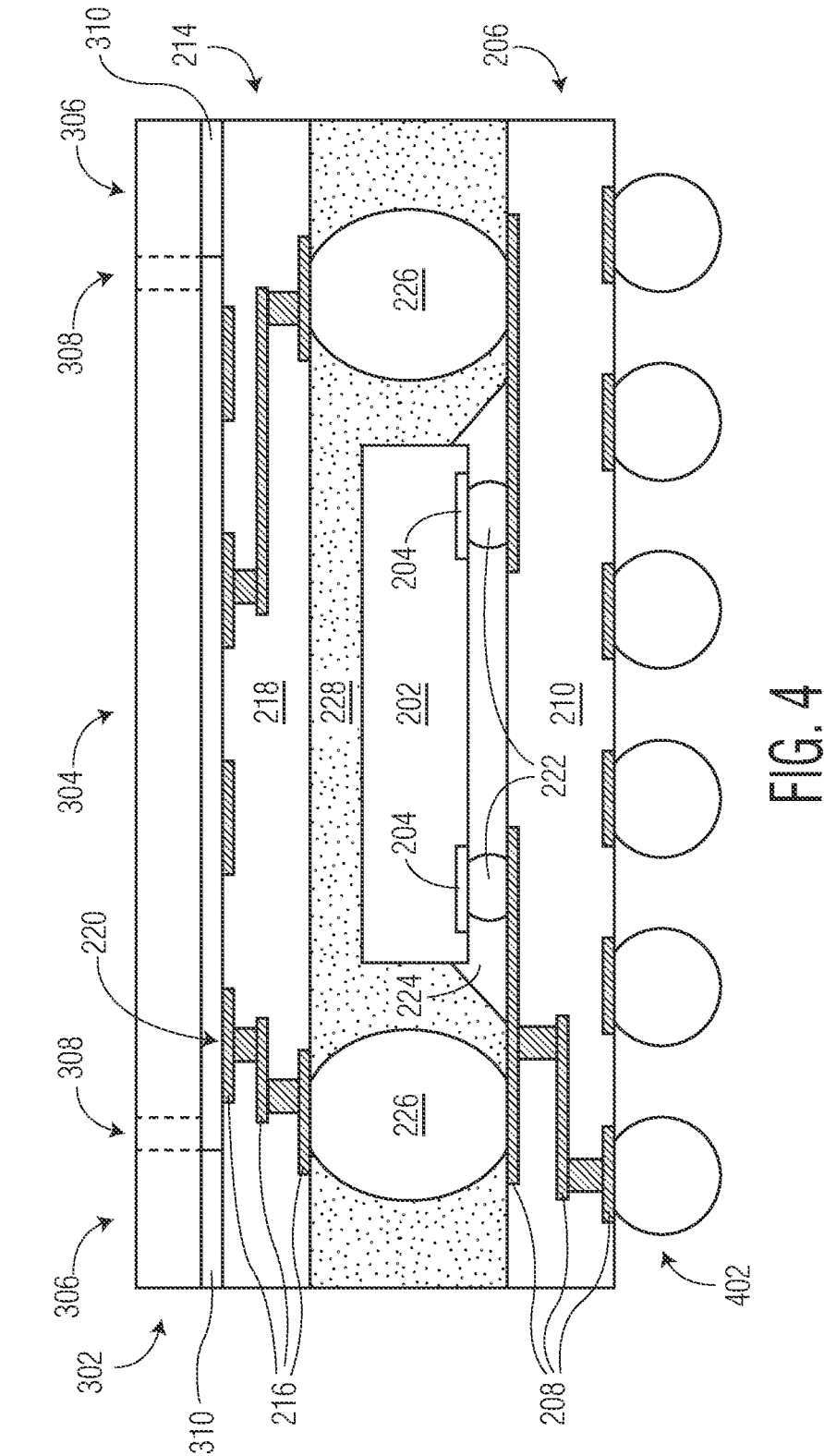

FIG. 4 illustrates, in a simplified cross-sectional view, the example semiconductor device 100 at a subsequent stage of manufacture in accordance with an embodiment. At this stage, the semiconductor device 100 includes a plurality of conductive package connectors 402 affixed to the bottom side of the package substrate 206. In this embodiment, the conductive package connectors 402 are attached to respective package connector pads (e.g., connector pads 212 of FIG. 3) at the bottom side of the package substrate 206 while the first region 304 of the dismantlable structure 302 is covering the plurality of POP pads 220 of the interposer substrate 214. Because the POP pads 220 are covered by the first region 304 of the dismantlable structure 302, the POP pads 220 are substantially protected during the package connectors 402 attachment operation. The conductive connectors 402 are configured to provide a conductive connection between the connector pads of the package substrate 206 and a printed circuit board, for example. The conductive connectors 402 may be formed in suitable conductive connector structures such as solder balls, gold studs, copper pillars, and the like. For illustration purposes, the conductive connectors 402 are formed as ball connectors and arranged in a ball grid array.

Figure 5:
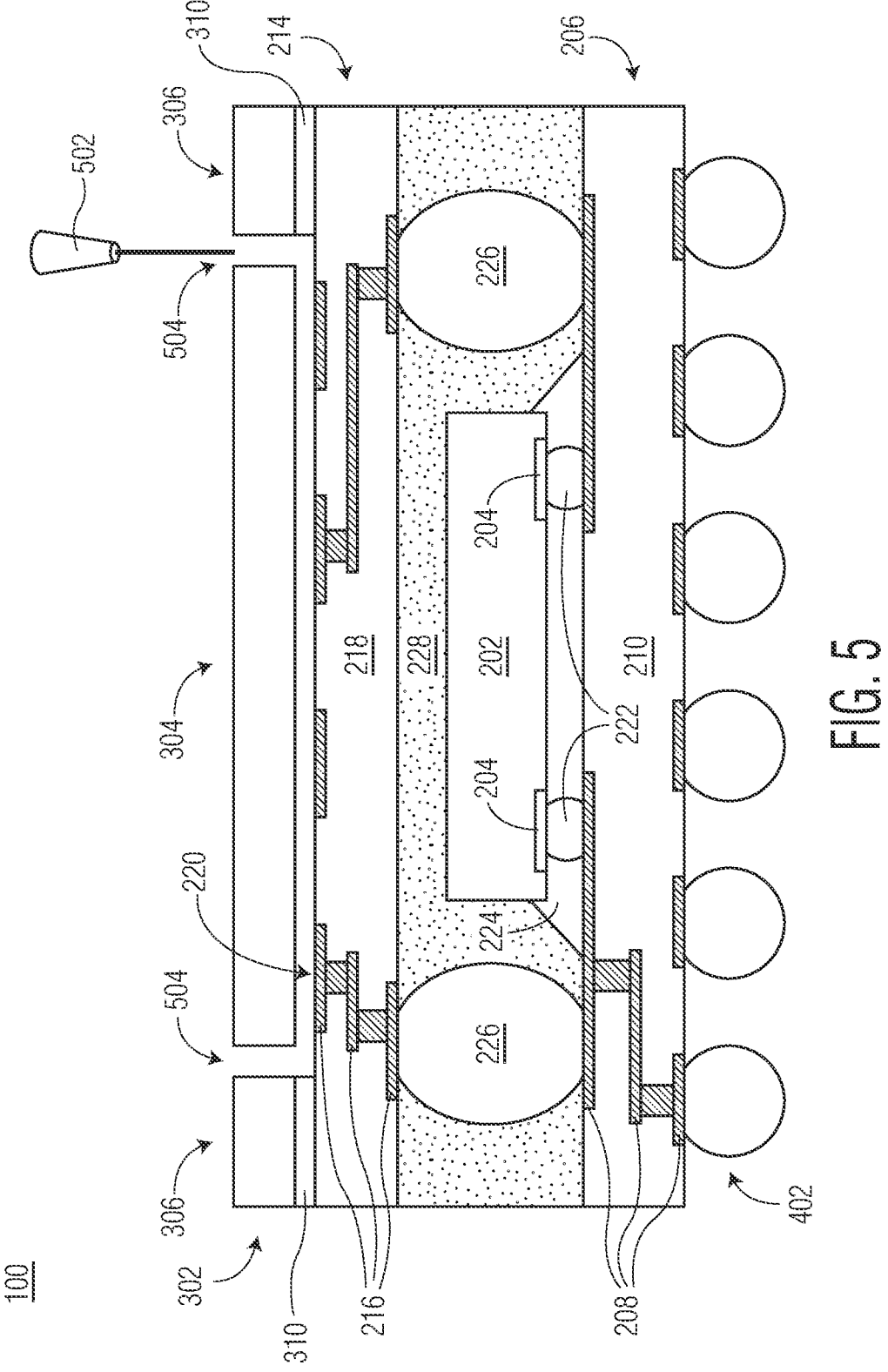

FIG. 5 illustrates, in a simplified cross-sectional view, the example semiconductor device 100 at a subsequent stage of manufacture in accordance with an embodiment. At this stage, the semiconductor device 100 includes the first region 304 of the dismantlable structure 302 disconnected from the second region 306. In this embodiment, the first region 304 is disconnected and completely separated from the second region 306 by forming openings 504 through the entire width of respective connecting segments 308 thus severing each of the plurality of connecting segments 308. The connecting segments 308 are subjected to a laser ablation process by way of a laser 502 to remove material from the connecting segments 308. The connecting segments 308 of the dismantlable structure 302 may be substantially removed in order to sever the first region 304 from the second region 306 by way of the laser ablation process, for example. In some embodiments, a chemical etch or mechanical sawing operation may be employed to sever the connecting segments 308 of the dismantlable structure 302. After severing each of the plurality of connecting segments 308, the disconnected first region 304 may be removed and discarded at a subsequent stage, for example.

Figure 6:
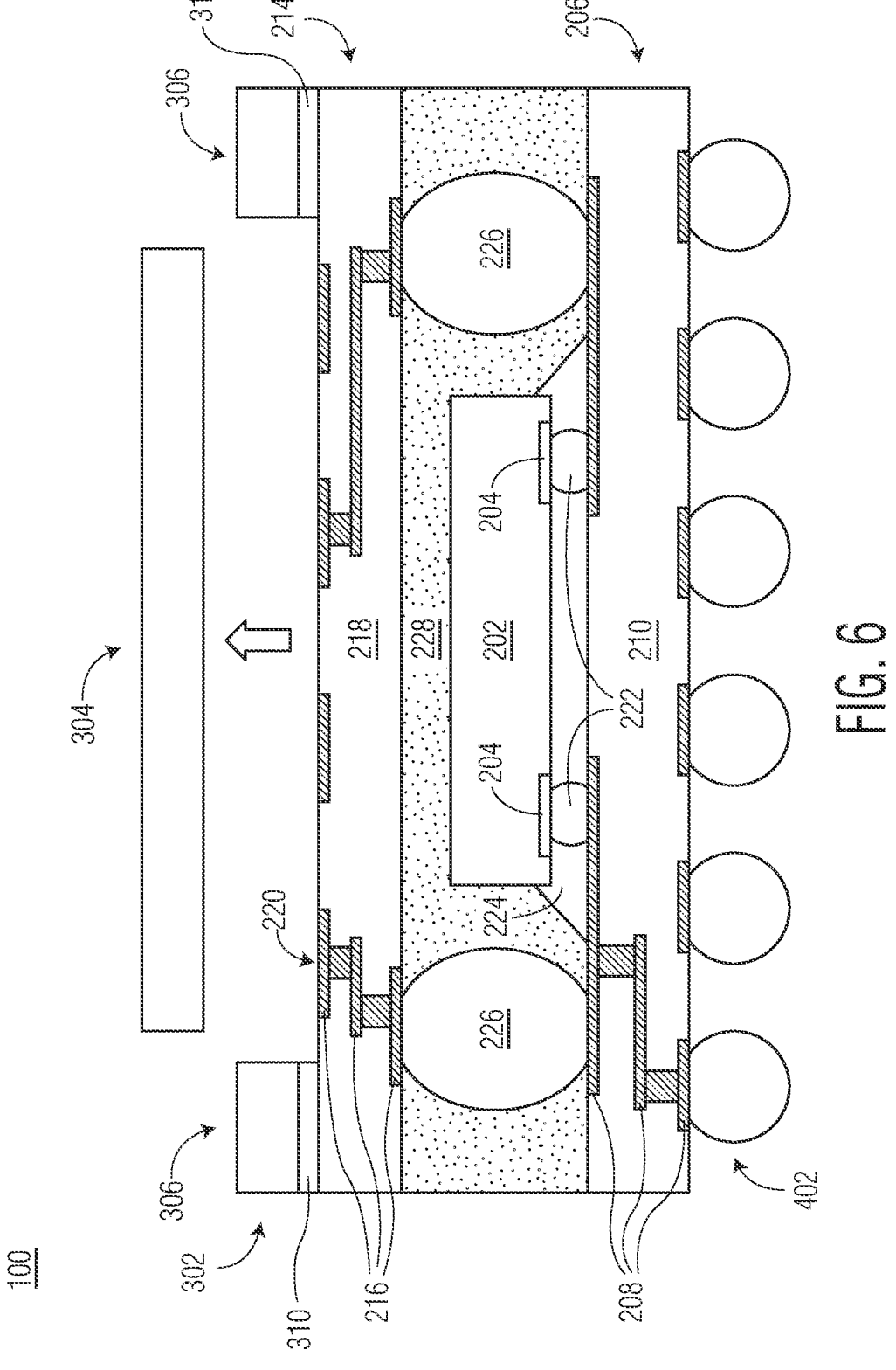

FIG. 6 illustrates, in a simplified cross-sectional view, the example semiconductor device 100 at a subsequent stage of manufacture in accordance with an embodiment. At this stage, the semiconductor device 100 includes the first region 304 of the dismantlable structure 302 disconnected from the second region 306 and completely removed. In this embodiment, after completely separating the first region 304 from the second region 306 by severing the connecting segments 308, the first region 304 of the dismantlable structure 302 may be removed and discarded. The disconnected first region 304 may be removed by techniques such as vacuum-assisted pick-and-place or gravity-assisted rotate and drop. After removing the first region 304 of the dismantlable structure 302, the second region 306 remains attached to the semiconductor device 100 and continues to provide structural support.

Figure 7:
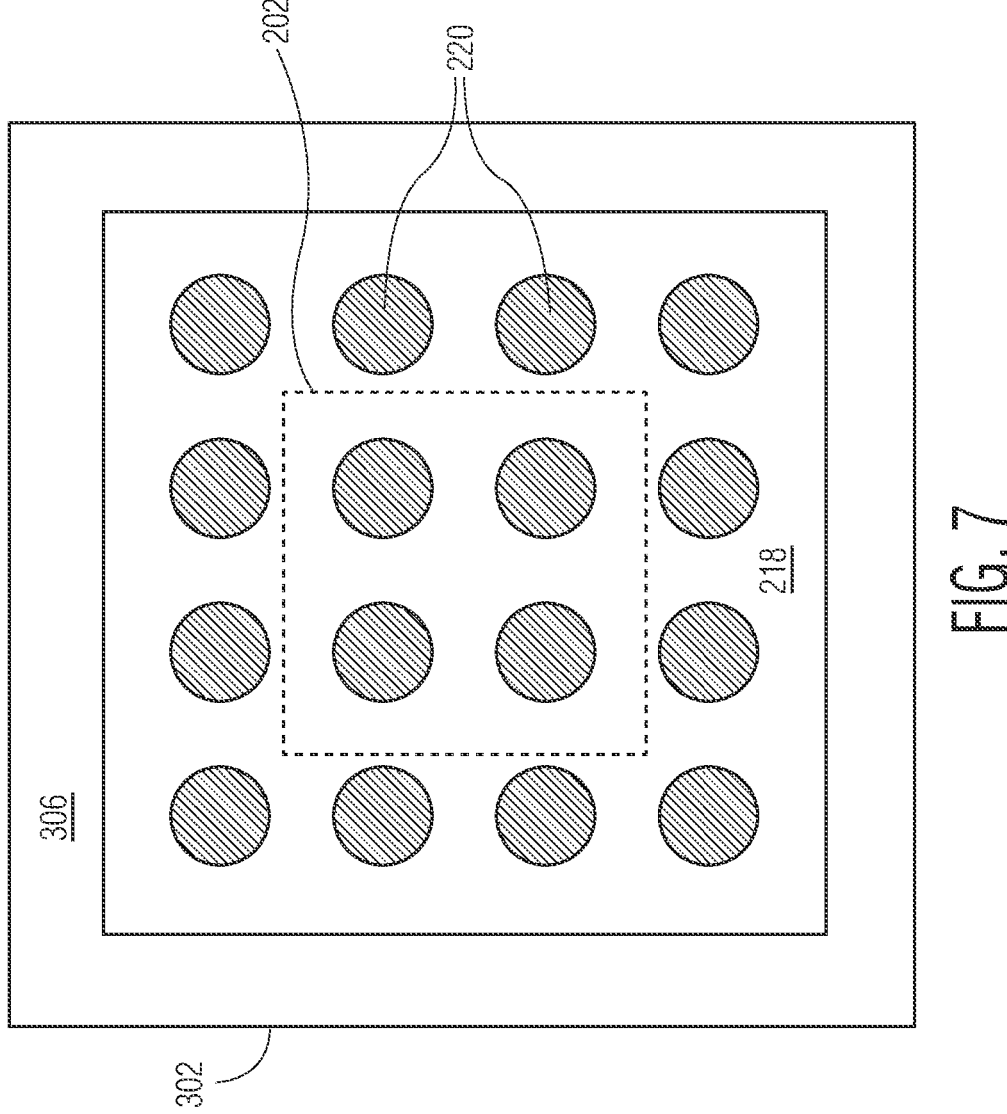
FIG. 7 illustrates, in a simplified top-side-up plan view, the example semiconductor device at a subsequent stage of manufacture depicted in FIG. 6 in accordance with an embodiment.

FIG. 7 illustrates, in a simplified top-side-up plan view, the example semiconductor device 100 at a stage of manufacture depicted in FIG. 6 in accordance with an embodiment. At this stage, the semiconductor device 100 includes the first region (304) of the dismantlable structure 302 completely removed. The embedded semiconductor die 202 of the semiconductor device 100 is shown as dashed outline for reference. In this embodiment, the plurality of conductive POP pads 220 formed at the top side of the interposer substrate 214 are revealed after removal of the first region of the dismantlable structure 302. The revealed POP pads 220 are surrounded by the non-conductive material 218 of the interposer substrate 214. The second region 306 is located around an outer perimeter region and surrounds the revealed POP pads 220 and the non-conductive material 218 at the top side of the interposer substrate 214. With the second region 306 remaining attached to the outer perimeter region of the semiconductor device 100, structural support provided by the dismantlable structure 302 is substantially maintained.

Generally, there is provided, a method including forming a packaged semiconductor die, the packaged semiconductor die including mounting the semiconductor die onto a package substrate in a flip chip orientation, a bond pad of the semiconductor die interconnected with a conductive trace of the package substrate; attaching an interposer substrate over a backside of the semiconductor die, the interposer substrate having a plurality of conductive pads exposed at a top surface, the plurality of conductive pads interconnected with the package substrate; and encapsulating with an encapsulant the semiconductor die and remaining gap region between the package substrate and the interposer substrate; and attaching a dismantlable structure onto the top surface of the interposer substrate, a first region of the dismantlable structure covering the plurality of conductive pads. The method may further include removing only the first region of the dismantlable structure to expose the plurality of conductive pads at the top surface of the interposer substrate. The method may further include affixing a plurality of conductive package connectors on a bottom side of the package substrate before removing only the first region of the dismantlable structure. The dismantlable structure may be formed from a rigid sheet of non-conductive material. The dismantlable structure may include a second region substantially surrounding the first region, the second region substantially isolated from the first region by a gap. The second region may be located proximate to an outer perimeter portion of the interposer substrate. The dismantlable structure may be attached to the top surface of the interposer substrate by way of an adhesive disposed between the second region and the top surface of the interposer substrate. The dismantlable structure may further include one or more connecting segments located between the first and second regions, each of the connecting segments flanked on two sides by the gap. The one or more connecting segments may be configured to be substantially removed by way of laser ablation to completely disconnect the first region from second region of the dismantlable structure.

In another embodiment, there is provided, a method including forming a packaged semiconductor die, the packaged semiconductor die including mounting the semiconductor die onto a package substrate in a flip chip orientation, a bond pad of the semiconductor die interconnected with a conductive trace of the package substrate; attaching an interposer substrate over a backside of the semiconductor die, the interposer substrate having a plurality of conductive pads exposed at a top surface, the plurality of conductive pads interconnected with the package substrate by way of a plurality of conductive substrate connectors; and encapsulating with an encapsulant the semiconductor die and remaining gap region between the package substrate and the interposer substrate; and attaching a dismantlable structure onto the top surface of the interposer substrate, a first region of the dismantlable structure covering the plurality of conductive pads. The interposer substrate may be characterized as a package-on-package (POP) substrate. The dismantlable structure may include a second region substantially surrounding the first region, the second region substantially isolated from the first region by a gap. The dismantlable structure may be attached to the top surface of the interposer substrate by way of an adhesive disposed between the second region and the top surface of the interposer substrate. The dismantlable structure may further include one or more connecting segments which join the first and second regions, each of the connecting segments flanked on two sides by the gap. The method may further include substantially removing the one or more connecting segments by way of laser ablation to completely disconnect the first region from second region of the dismantlable structure.

In yet another embodiment, there is provided, a method including forming a packaged semiconductor die, the packaged semiconductor die including mounting the semiconductor die onto a package substrate in a flip chip orientation, a bond pad of the semiconductor die interconnected with a conductive trace of the package substrate; attaching an interposer substrate over a backside of the semiconductor die, the interposer substrate having a plurality of conductive pads exposed at a top surface, the plurality of conductive pads interconnected with the package substrate by way of a plurality of conductive substrate connectors; and encapsulating with an encapsulant the semiconductor die and remaining gap region between the package substrate and the interposer substrate; dispensing an adhesive onto the top surface of the interposer substrate; and attaching a dismantlable structure onto the interposer substrate by way of the adhesive, the dismantlable structure including a first region covering the plurality of conductive pads and a second region joined to the first region by way of one or more connecting segments of the dismantlable structure. Each of the one or more connecting segments may be flanked on two sides by a gap substantially separating the first region from the second region of the dismantlable structure. The adhesive may be dispensed onto the top surface of the interposer substrate proximate to an outer perimeter portion of the interposer substrate. The method may further include substantially removing the one or more connecting segments by way of laser ablation to completely separate the first region from the second region of the dismantlable structure; and removing only the first region of the dismantlable structure to expose the plurality of conductive pads at the top surface of the interposer substrate. The dismantlable structure may be formed from a rigid sheet of non-conductive material comprising a glass cloth base and epoxy resin.

By now, it should be appreciated that there has been provided a semiconductor device having a dismantlable structure. The semiconductor device includes the dismantlable structure attached at a top side of a packaged semiconductor die. The packaged semiconductor die is formed with a flip-chip mounted semiconductor die on a package substrate and an interposer substrate mounted over the semiconductor die and interconnected with the package substrate. The semiconductor die being disposed between the package substrate and the interposer substrate is encapsulated with an encapsulant. The dismantlable structure is formed from a substantially rigid sheet of non-conductive material and attached to a top side of the packaged semiconductor die. The dismantlable structure includes a first region configured to temporarily protect underlying features of the packaged semiconductor die and a second region substantially surrounding the first region. The second region is attached to the top side of the packaged semiconductor die by way of an adhesive disposed along an outer perimeter. The second region is separated from the first region by a series of gaps strung together around a perimeter of the first region. A plurality of connecting segments joins the first region and the second region across the gaps. The connecting segments are configured to be severed (e.g., by way of laser ablation) to completely separate the first region from the attached second region. After severing each of the connecting segments, the first region of the dismantlable structure is removed and the underlying features of the packaged semiconductor die are revealed. Accordingly, the dismantlable structure may protect features (e.g., contact pads, traces) formed at the top side of the packaged semiconductor die from damage or contamination during handling and subsequent packaging steps, then reveal these features in pristine condition by removing the first region, for example.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
forming a packaged semiconductor die, the packaged semiconductor die comprising:
mounting the semiconductor die onto a package substrate in a flip chip orientation, a bond pad of the semiconductor die interconnected with a conductive trace of the package substrate;
attaching an interposer substrate over a backside of the semiconductor die, the interposer substrate having a plurality of conductive pads exposed at a top surface, the plurality of conductive pads interconnected with the package substrate; and
encapsulating with an encapsulant the semiconductor die and remaining gap region between the package substrate and the interposer substrate; and attaching a dismantlable structure onto the top surface of the interposer substrate, a first region of the dismantlable structure covering the plurality of conductive pads.

2. The method of claim 1, further comprising removing only the first region of the dismantlable structure to expose the plurality of conductive pads at the top surface of the interposer substrate.

3. The method of claim 2, further comprising affixing a plurality of conductive package connectors on a bottom side of the package substrate before removing only the first region of the dismantlable structure.

4. The method of claim 1, wherein the dismantlable structure is formed from a rigid sheet of non-conductive material.

5. The method of claim 1, wherein the dismantlable structure includes a second region substantially surrounding the first region, the second region substantially isolated from the first region by a gap.

6. The method of claim 5, wherein the second region is located proximate to an outer perimeter portion of the interposer substrate.

7. The method of claim 5, wherein the dismantlable structure is attached to the top surface of the interposer substrate by way of an adhesive disposed between the second region and the top surface of the interposer substrate.

8. The method of claim 5, wherein the dismantlable structure further includes one or more connecting segments located between the first and second regions, each of the connecting segments flanked on two sides by the gap.

9. The method of claim 8, wherein the one or more connecting segments are configured to be substantially removed by way of laser ablation to completely disconnect the first region from second region of the dismantlable structure.

10. A method comprising:
forming a packaged semiconductor die, the packaged semiconductor die comprising:
mounting the semiconductor die onto a package substrate in a flip chip orientation, a bond pad of the semiconductor die interconnected with a conductive trace of the package substrate;
attaching an interposer substrate over a backside of the semiconductor die, the interposer substrate having a plurality of conductive pads exposed at a top surface, the plurality of conductive pads interconnected with the package substrate by way of a plurality of conductive substrate connectors; and
encapsulating with an encapsulant the semiconductor die and remaining gap region between the package substrate and the interposer substrate; and
attaching a dismantlable structure onto the top surface of the interposer substrate, a first region of the dismantlable structure covering the plurality of conductive pads.

11. The method of claim 10, wherein the interposer substrate is characterized as a package-on-package (POP) substrate.

12. The method of claim 10, wherein the dismantlable structure includes a second region substantially surrounding the first region, the second region substantially isolated from the first region by a gap.

13. The method of claim 12, wherein the dismantlable structure is attached to the top surface of the interposer substrate by way of an adhesive disposed between the second region and the top surface of the interposer substrate.

14. The method of claim 12, wherein the dismantlable structure further includes one or more connecting segments which join the first and second regions, each of the connecting segments flanked on two sides by the gap.

15. The method of claim 14, further comprising substantially removing the one or more connecting segments by way of laser ablation to completely disconnect the first region from second region of the dismantlable structure.

16. A method comprising:

forming a packaged semiconductor die, the packaged semiconductor die comprising:

mounting the semiconductor die onto a package substrate in a flip chip orientation, a bond pad of the semiconductor die interconnected with a conductive trace of the package substrate;

attaching an interposer substrate over a backside of the semiconductor die, the interposer substrate having a plurality of conductive pads exposed at a top surface, the plurality of conductive pads interconnected with the package substrate by way of a plurality of conductive substrate connectors; and encapsulating with an encapsulant the semiconductor die and remaining gap region between the package substrate and the interposer substrate;

dispensing an adhesive onto the top surface of the interposer substrate; and attaching a dismantlable structure onto the interposer substrate by way of the adhesive, the dismantlable structure including a first region covering the plurality of conductive pads and a second region joined to the first region by way of one or more connecting segments of the dismantlable structure.

17. The method of claim 16, wherein each of the one or more connecting segments are flanked on two sides by a gap substantially separating the first region from the second region of the dismantlable structure.

18. The method of claim 16, wherein the adhesive is dispensed onto the top surface of the interposer substrate proximate to an outer perimeter portion of the interposer substrate.

19. The method of claim 16, further comprising:

substantially removing the one or more connecting segments by way of laser ablation to completely separate the first region from the second region of the dismantlable structure; and removing only the first region of the dismantlable structure to expose the plurality of conductive pads at the top surface of the interposer substrate.

20. The method of claim 16, wherein the dismantlable structure is formed from a rigid sheet of non-conductive material comprising a glass cloth base and epoxy resin.

* * * * *